United States Patent
Osanai

(10) Patent No.: US 7,227,231 B2
(45) Date of Patent: Jun. 5, 2007

(54) SEMICONDUCTOR INTEGRATED CIRCUIT DEVICE

(75) Inventor: Jun Osanai, Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 11/066,033

(22) Filed: Feb. 25, 2005

(65) Prior Publication Data

US 2005/0190628 A1    Sep. 1, 2005

(30) Foreign Application Priority Data

Feb. 27, 2004    (JP)    ............................. 2004-053727

(51) Int. Cl.
*H01L 27/08* (2006.01)
*H01L 21/8238* (2006.01)
*H01L 27/095* (2006.01)

(52) U.S. Cl. ............... 257/369; 257/351; 257/758; 257/766; 257/E27.046; 257/E27.061; 257/E21.632

(58) Field of Classification Search ............... None
See application file for complete search history.

(56) References Cited

U.S. PATENT DOCUMENTS

| 6,215,187 | B1 * | 4/2001 | Ooto et al. ............... 257/758 |
| 6,281,088 | B1 * | 8/2001 | Kim ............................ 438/306 |
| 6,346,730 | B1 * | 2/2002 | Kitakado et al. ........... 257/350 |
| 6,891,195 | B2 * | 5/2005 | Yamazaki et al. ............. 257/59 |
| 7,105,900 | B2 * | 9/2006 | Jung et al. .................. 257/379 |

* cited by examiner

*Primary Examiner*—Leonardo Andujap
*Assistant Examiner*—Victor A. Mandala, Jr.
(74) *Attorney, Agent, or Firm*—Adams & Wilks

(57) ABSTRACT

A semiconductor integrated circuit device has a first MOS transistor and a second MOS transistor. The first MOS transistor has a first source, a first gate electrode, and a first wiring metal connected to the first source and overlapping the first gate electrode. The second MOS transistor has a second source, a second gate electrode, and a second wiring metal connected to the second source. The first wiring metal of the first MOS transistor and the second wiring metal are positioned so that they do not overlap the second gate electrode.

6 Claims, 4 Drawing Sheets

SEMICONDUCTOR INTEGRATED CIRCUIT DEVICE

BACKGROUND OF THE INVENTION

1. Field of the Invention

The present invention relates to an analog semiconductor device having a sensor or power management function.

2. Description of the Related Art

When an analog semiconductor integrated circuit device having a sensor or power management function is constructed from MOS transistors, a plurality of threshold voltages (hereinafter, referred to as "Vth") of MOS transistors are generally used instead of a single Vth to meet such a need as to deal with complicated analog signal processing or various input voltage levels. Such multi-Vth technique is used.

In a conventional semiconductor integrated circuit device as shown in FIG. 4, a combination of photolithography and ion implantation, by which a Vth of a MOS transistor is determined, is repeated several times to attain multiple vths (refer to Japanese Patent Application P2000-323587A (page 6, FIG. 2), for example). In FIG. 4(a) the first ion implantation 203 is carried out using photoresist 202 formed on the substrate 201 as a mask. And in FIG. 4(b) the second ion implantation 205 is carried out using photoresist 204 as a mask.

Since the conventional method requires repeating steps of photolithography and ion implantation several times for attaining the multiple Vth as shown above, there arises a problem in terms of a longer manufacturing period, which affects product delivery, and a higher manufacturing cost.

SUMMARY OF THE INVENTION

The present invention adopts the following means in order to solve the aforementioned problem.

(1) A semiconductor integrated circuit device, comprising: a first MOS transistor in which wiring metal connected to a source of the MOS transistor overlaps a gate electrode of the MOS transistor on a side of the source; and a second MOS transistor in which wiring metal connected to a source does not overlap a gate electrode on a side of the source.

(2) The semiconductor integrated circuit device according to (1), in which a ratio of an overlap amount in which the wiring metal overlaps the gate electrode in the first MOS transistor to a channel width is a predetermined value of 0 or larger and 1 or smaller.

(3) The semiconductor integrated circuit device according to (1), in which an overlap amount in which the wiring metal overlaps the gate electrode in the first MOS transistor is 0.2 µm or more.

According to the present invention, a multi-Vth integrated circuit can be attained without increasing the number of steps, and quick product delivery, which is comparable with that of a product available with a non-multi-Vth technique, is possible.

DETAILED DESCRIPTION OF THE PREFERRED EMBODIMENTS

Hereinafter, preferred embodiments of the present invention will be described with reference to the accompanying drawings.

(First Embodiment)

Figure 1:
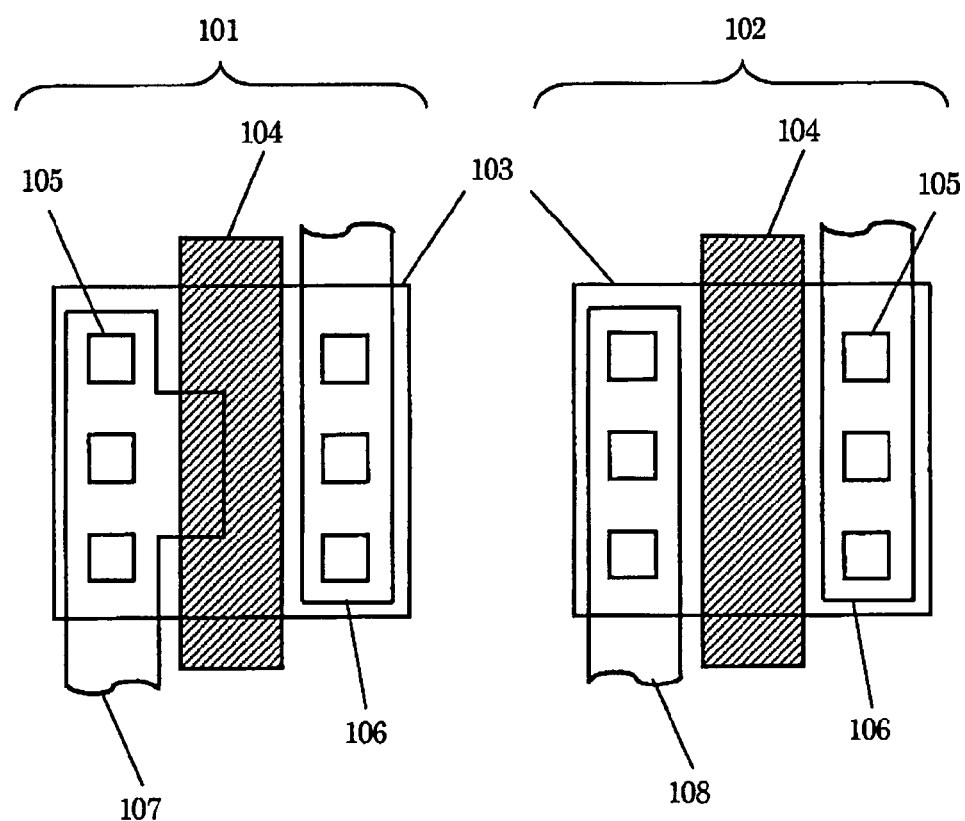
FIG. 1 is a schematic plan view showing a semiconductor integrated circuit device according to a first embodiment of the present invention.

FIG. 1 is a schematic plan view showing a semiconductor integrated circuit device according to a first embodiment of the present invention and shows a first MOS transistor 101 comprising an active region 103 that defines a MOS transistor region, a gate electrode 104 of the MOS transistor, a contact 105 for electrically connecting between source/drain of the MOS transistor and wiring metal, a source wiring metal 107, and a drain wiring metal 106, and a second MOS transistor 102 having the similar structure as that of the first MOS transistor.

Here, the first MOS transistor differs from the second MOS transistor in terms of patterns of the source wiring metals 107 and 108. In an ordinary layout, the source wiring metal does not overlap the gate electrode as in the second MOS transistor. When the source wiring metal overlaps the gate electrode, the Vth increases in an NMOS transistor and decreases in a PMOS transistor, which means that an absolute value of the Vth increase in both of the MOS transistors.

In general, the MOS transistor has an interface state at an interface between a semiconductor substrate and a gate insulating film. The interface state density is high in a region where the gate electrode overlaps the source/drain. Since the interface state are terminated by hydrogen atom diffusing into the insulating film and reaching the interface between the semiconductor substrate and the gate insulating film at the time of sintering in an atmosphere containing hydrogen that promotes an alloying reaction between the wiring metal and the semiconductor, or formation of a protective film containing hydrogen such as a plasma nitride film, the interface state density lowers.

When the source/drain wiring metals are laid out to overlap the gate electrode, the wiring metal suppresses the hydrogen diffusion. Thus, in a MOS transistor having such a layout, the interface state density is not reduced, and an absolute value of the Vth becomes large.

The present invention makes use of this phenomenon. In FIG. 1, the first MOS transistor has a large absolute value of the Vth as compared with the second MOS transistor. Hence, the multi-Vth can be attained on the same semiconductor integrated circuit without increasing the number of steps.

Figure 2:
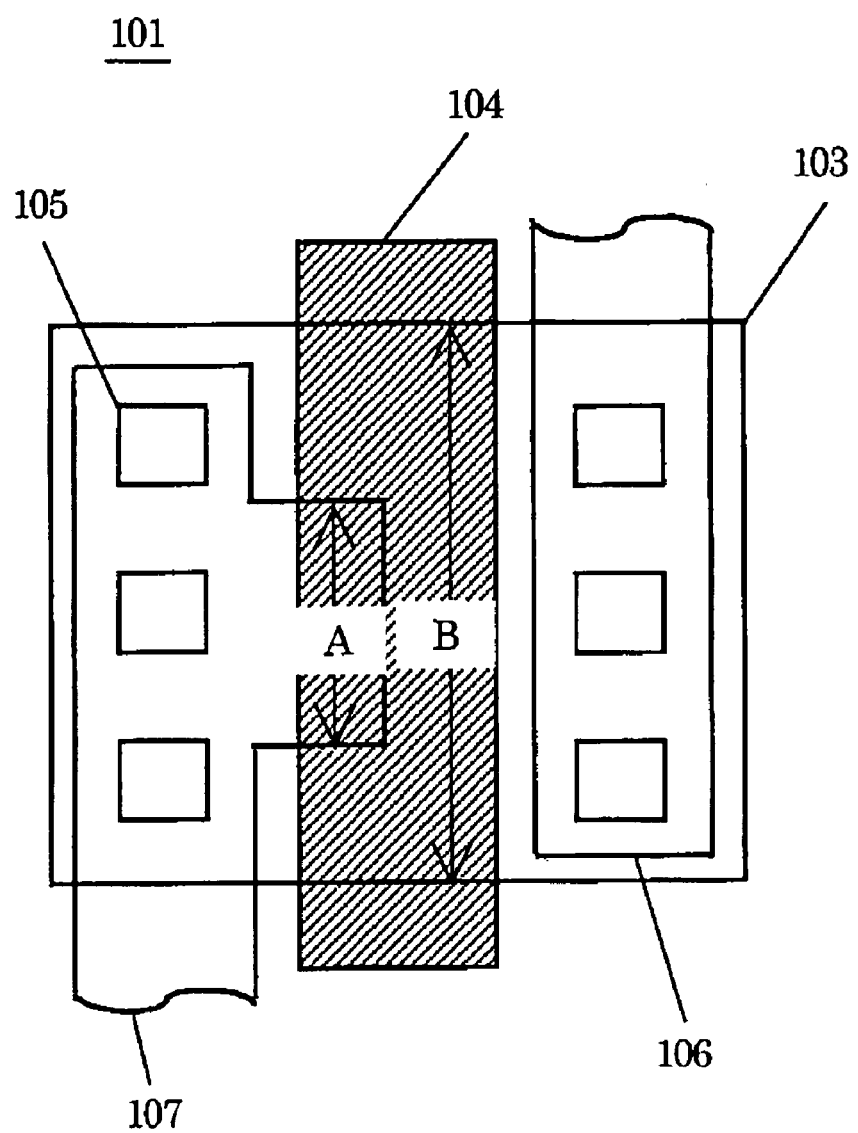
FIG. 2 is an enlarged schematic plan view of the semiconductor integrated circuit device according to the first embodiment of the present invention.

FIG. 2 is an enlarged plan view of the first MOS transistor according to the present invention. An increase of the Vth is variable depending on a ratio between a channel width B and an overlap width A in which the wiring metal overlaps the gate electrode in the channel width direction as shown in FIG. 2. Assuming that A/B=100%, the Vth is about 0.3 V higher than that of the MOS transistor not having such an overlap portion, although an increase of the Vth depends on a gate insulating film thickness and a substrate concentration. Assuming that A/B=0, the Vth is equal to that of the MOS transistor not having the portion where the wiring metal overlaps the gate electrode. The Vth changes in proportion to an A/B ratio, so the multi-vth is attained more finely than that attain by the conventional multi-vth technique based on a photo-step and an ion implantation step, by changing a pattern design value.

If the drain wiring metal overlaps the gate electrode, the same effect is obtained. In the case of operating the MOS transistor in a saturated mode, an increase of the Vth is small, and thus it is more effective to form the source wiring metal to overlap the gate electrode. Note that effects of the present invention can be expected under such a condition that the overlap width in which the wiring metal overlaps the gate electrode is 0.2 µm or more.

(Second Embodiment)

Figure 3:
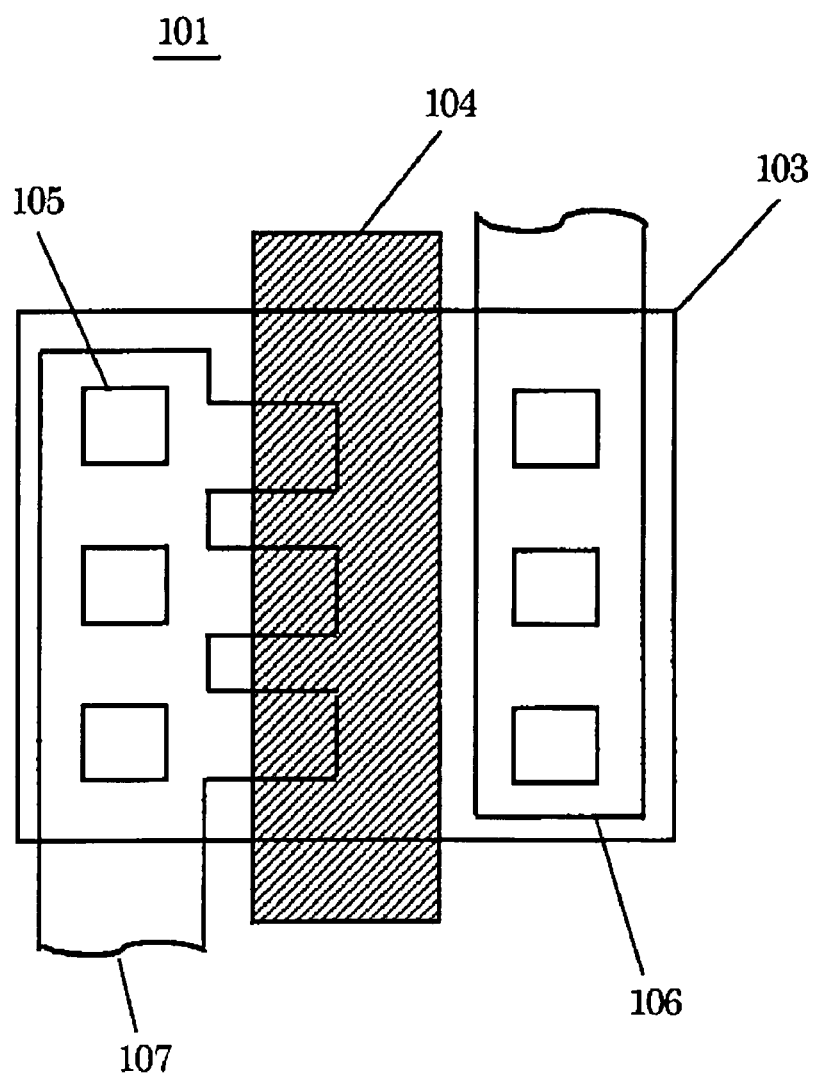
FIG. 3 is a schematic plan view showing a semiconductor integrated circuit device according to a second embodiment of the present invention.
Figure 4:
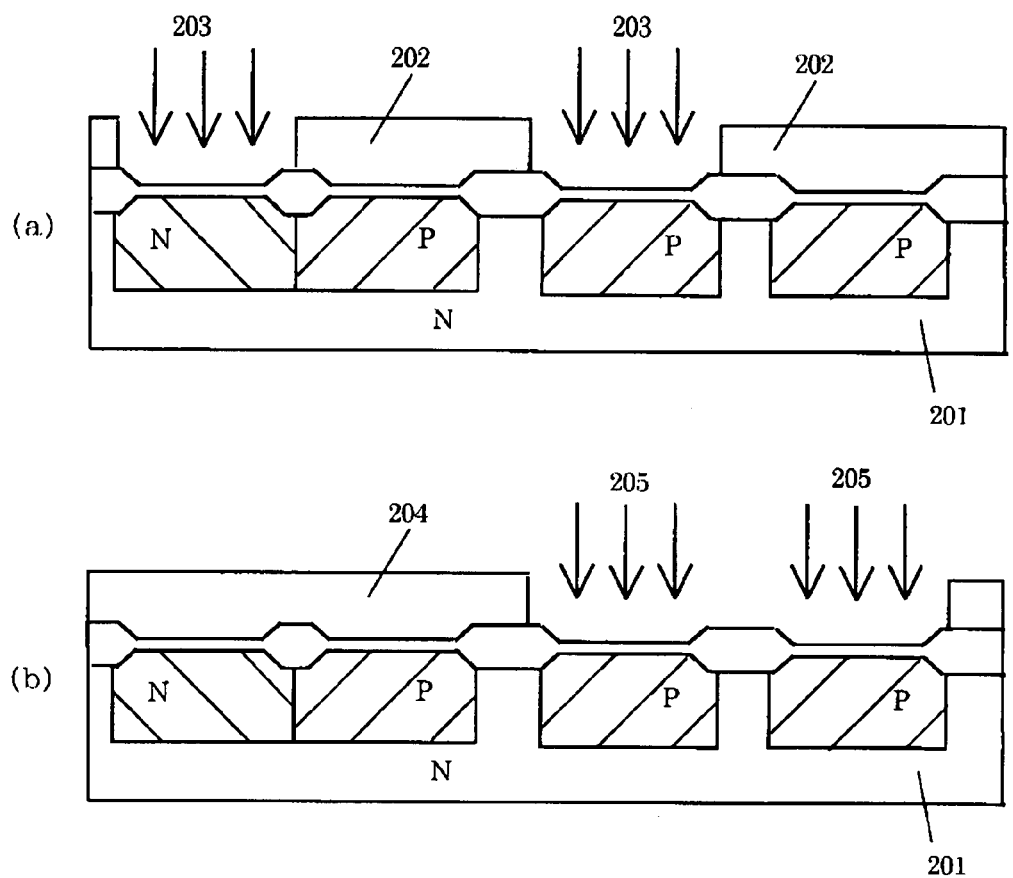
FIGS. 4A and 4B are schematic sectional views each showing a conventional device.

FIG. 3 is a schematic plan view showing a semiconductor integrated circuit device according to a second embodiment of the present invention. The second embodiment differs from the first embodiment in that the wiring metal overlaps the gate electrode in a finely separated form. Stated otherwise, the wiring metal has plural portions spaced-apart in a channel width direction of the MOS transistor so as to form a combshaped structure. However, the principle explained with reference to FIGS. 1 and 2 applies thereto, and such a layout produces the similar effect as well. The present invention is applicable to a MOS transistor having either an N-type conductivity or a P-type conductivity, that is, either an NMOS transistor or a PMOS transistor. The similar effect can be obtained with the Vth of either a normally off type (enhancement type) or a normally on type (depletion type).

As has been described so far, according to the present invention, the multi-Vth integrated circuit can be attained without increasing a cost nor prolonging a manufacturing period, consequently, it is possible to provide the high-value added analog semiconductor integrated circuit device with high performance.

What is claimed is:

1. A semiconductor integrated circuit device comprising:
   a first MOS transistor having a first source, a first gate electrode, and a first wiring metal connected to the first source and having a plurality of spaced-apart portions overlapping the first gate electrode of the first MOS transistor; and
   a second MOS transistor having a second source, a second gate electrode, and a second wiring metal connected to the second source, the first wiring metal of the first MOS transistor and the second wiring metal being positioned so that they do not overlap the second gate electrode.

2. A semiconductor integrated circuit device according to claim 1; wherein the spaced-apart portions of the first wiring metal are spaced-apart in a channel width direction of the first MOS transistor.

3. A semiconductor integrated circuit device according to claim 1; wherein the spaced-apart portions of the wiring metal form a combshaped structure.

4. A semiconductor integrated circuit device comprising:
   a first MOS transistor having a first source wiring metal, a first drain wiring metal, and a first gate electrode, the first source wiring metal having a plurality of spaced-apart portions overlapping the first gate electrode; and
   a second MOS transistor having a second source wiring metal, a second drain wiring metal, and a second gate electrode, the first and second source wiring metals and the first and second drain wiring metals being positioned so that they do not overlap the second gate electrode.

5. A semiconductor circuit device according to claim 4; wherein the spaced-apart portions of the first source wiring metal are spaced-apart in a channel width direction of the first MOS transistor.

6. A semiconductor circuit device according to claim 4; wherein the spaced-apart portions of the first source wiring metal form a comb-shaped structure.

* * * * *